(12) United States Patent
Sunwoo et al.

(10) Patent No.: US 7,245,140 B2
(45) Date of Patent: Jul. 17, 2007

(54) PARAMETER MEASUREMENT OF SEMICONDUCTOR DEVICE FROM PIN WITH ON DIE TERMINATION CIRCUIT

(75) Inventors: Jung Sunwoo, Seoul (KR); Jung-Bae Lee, Yongin-Si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 80 days.

(21) Appl. No.: 10/987,706

(22) Filed: Nov. 12, 2004

(65) Prior Publication Data

US 2005/0253615 A1 Nov. 17, 2005

(30) Foreign Application Priority Data

May 13, 2004 (KR) ...................... 10-2004-0033808

(51) Int. Cl.
G01R 31/26 (2006.01)
G11C 7/00 (2006.01)

(52) U.S. Cl. ...................... 324/765; 365/201

(58) Field of Classification Search ................ 324/765, 324/755, 763, 158.1; 365/201; 714/718, 714/733, 734
See application file for complete search history.

(56) References Cited

U.S. PATENT DOCUMENTS 5,642,057 A * 6/1997 Oke et al. ................... 324/763
6,271,704 B1 * 8/2001 Babcock et al. ............ 327/309
6,396,285 B1 * 5/2002 Blackham ................... 324/601
6,928,007 B2 * 8/2005 Jin .............................. 365/194
6,958,613 B2 * 10/2005 Braun et al. ................ 324/601
7,019,555 B2 * 3/2006 Lee ............................. 326/30
2005/0283671 A1 * 12/2005 Stave ......................... 714/31

OTHER PUBLICATIONS

Korean Patent Publication No. 010065681 having Publication date of Jul. 11, 2001 (w/ English Abstract page).
Korean Patent Publication No. P2003-0006525 having Publication date of Jan. 23, 2005 (w/ English Abstract page).
Korean Patent Publication No. P2003-0032831 having Publication date of Apr. 26, 2003 (w/ English Abstract page).
Japanese Patent Publication No. JP2003068082 having Publication date of Feb. 27, 2003 (w/ English Abstract page).

* cited by examiner

*Primary Examiner*—Ha Tran Nguyen
*Assistant Examiner*—Roberto Velez
(74) *Attorney, Agent, or Firm*—Monica H. Choi

(57) ABSTRACT

A semiconductor device includes an ODT (on die termination) pin coupled to a tester that applies a tester termination control signal thereon. The semiconductor device also includes a measure path that transmits the tester termination control signal from the ODT pin to an ODT circuit during measurement of a parameter of the semiconductor device. The ODT pin and the measure path advantageously allow for control of the ODT circuit by the tester for more accurate parameter characterization.

18 Claims, 6 Drawing Sheets

PARAMETER MEASUREMENT OF SEMICONDUCTOR DEVICE FROM PIN WITH ON DIE TERMINATION CIRCUIT

BACKGROUND OF THE INVENTION

This application claims priority to Korean Patent Application No. 2004-0033808, filed on May 13, 2004, in the Korean Intellectual Property Office, the disclosure of which is incorporated herein in its entirety by reference.

1. Field of the Invention

The present invention relates generally to characterization of semiconductor devices, and more particularly, to having separate signal transmission paths for normal operation of the semiconductor device and for parameter measurement of the semiconductor device.

2. Description of the Related Art

A scattering (S) parameter, measured for a semiconductor device such as a memory device, is the ratio of an output signal to an input signal in a frequency domain. The S parameter is comprised of an input reflection coefficient such as S11 and a transmission coefficient such as S21, as known to one of ordinary skill in the art. The S parameter is widely used to determine characteristics (such as an RLC value) of a system operating at radio frequency. U.S. Pat. No. 6,300,775 discloses a network analyzer which is an example of an S parameter measurement instrument.

FIG. 1 schematically shows a conventional memory system 100. The conventional memory system 100 includes a memory controller 110, a bus channel 120, memory modules 130 and 140, and memory slots 150 and 160.

The memory controller 110 controls the memory system 100 so that data is input/output into/from the memory modules 130 and 140 via the bus channel 120. The memory controller 110 is also referred to as a chipset.

The bus channel 120 includes a data bus and a control bus. The control bus transmits a control signal such as a clock signal or an address signal used for controlling data transmission via the data bus.

The memory modules 130 and 140 are installed (or inserted) in (or into) the memory slots 150 and 160, respectively, and are connected to the memory controller 110 via the bus channel 120. Referring to FIG. 1, the memory modules 130 and 140 each are dual in-line memory modules (DiMM) having dual ranks [R0, R1] and [R2, R3], respectively. However, each of the memory modules 130 and 140 may be a DiMM having a single rank. Each rank of a memory module includes at least one semiconductor memory device (such as a DRAM (dynamic random access memory) device).

Each of the memory modules 130 and 140 includes on die termination (ODT) circuits. Each semiconductor device of the memory modules 130 and 140 includes a respective one of the ODT circuits [131, 132] and [141, 142]. Each ODT circuit is a termination matching circuit installed inside of a respective semiconductor memory device for preventing distortion of data caused by signal reflection during normal operation (such as a read/write operation) of the semiconductor memory devices. Each of the ODT circuits [131, 132] and [141, 142] is connected to a DQ pin or a DQ port of the respective semiconductor memory device.

The operation of the ODT circuits [131, 132] and [141, 142] is now described. Assume that the semiconductor memory devices [R0, R1] of the first memory module 130 perform a write operation or a read operation. In that case, the ODT circuits [141, 142] of the second memory module 140 are turned on (or activated) in response to a first termination control signal transmitted via the bus channel 120 for impedance matching with the bus channel 120. Additionally in that case, the ODT circuits [131, 132] of the first memory module 130 are turned off (or deactivated) in response to a second termination control signal transmitted via the bus channel 120. The first and second termination control signals are generated by the memory controller 110.

On the other hand, assume that the semiconductor memory devices [R2, R3] of the second memory module 140 perform a write operation or a read operation. In that case, the ODT circuits [131, 132] of the first memory module 130 are turned on (or activated) in response to the first termination control signal transmitted via the bus channel 120 for impedance matching with the bus channel 120. Additionally in that case, the ODT circuits [141, 142] of the second memory module 140 are turned off (or deactivated) in response to the second termination control signal transmitted via the bus channel 120.

FIG. 2 is a circuit diagram showing an example of an ODT circuit 131 of FIG. 1. The ODT circuit 131 of FIG. 2 is a center tap termination (CTT) type including switches SW1 and SW2 and termination resistors RT1 and RT2. The other ODT circuits 132, 141, and 142 of FIG. 1 are implemented similarly as the ODT circuit 131 of FIG. 2.

Each of the switches SW1 and SW2 may be implemented as a MOS transistor. Each of the switches SW1 and SW2 turns on the ODT circuit 131 in response to the activation of a first termination control signal ODT_C (i.e., when the ODT_C signal has a logical high state). That is, the switches SW1 and SW2 turn on within the ODT circuit 131 to couple a power supply voltage VDDQ to a first termination resistor RT1 and to couple a ground voltage VSSQ to a second termination resistor RT2.

When the switches SW1 and SW2 are closed for such coupling of the voltages VDDQ and VSSQ to the termination resistors RT1 and RT2, the ODT circuit 131 is deemed to be turned on. On the other hand, when the switches SW1 and SW2 are opened such that the voltages VDDQ and VSSQ are disconnected from the termination resistors RT1 and RT2, the ODT circuit 131 is deemed to be turned off.

The termination resistors RT1 and RT2 have the same resistance. The termination resistors RT1 and RT2 are connected together at a node A that is also connected to a DQ pin of the respective semiconductor memory device having the ODT circuit 131 therein.

A scattering parameter such as the S11 parameter is desired to be measured by a network analyzer (which is an example tester) from the DQ pin of the semiconductor memory device. Such a scattering parameter is used for designing the bus channel 120 to which the memory modules 130 and 140 and the memory controller 110 are coupled.

Conventionally, the S11 parameter is measured in a state where the ODT circuit of the semiconductor memory device is turned off (i.e., the switches SW1 and SW2 are turned off in FIG. 2) after power is supplied to the semiconductor memory device. However, the semiconductor memory devices in FIG. 1 perform normal operations with the ODT circuits being turned on or off. Thus, the S11 parameter measured in the conventional manner does not accurately characterize the bus channel 120 during normal operation of the semiconductor memory devices.

With such inaccurate characterization of the bus channel 120, integrity of the signals transmitted within the memory system 100 is compromised, especially at higher operating frequencies of the memory system 100.

Thus, a mechanism is desired for more accurately measuring a parameter from a DQ pin of the memory device with control of the ODT circuit coupled to the DQ pin.

SUMMARY OF THE INVENTION

Accordingly, a switch and a measure path are added to a semiconductor device for control of the ODT circuit during measure of the parameter from the DQ pin.

In one aspect of the present invention, a semiconductor device includes an ODT (on die termination) pin coupled to a tester that applies a tester termination control signal thereon. The semiconductor device also includes a measure path that transmits the tester termination control signal from the ODT pin to an ODT circuit during measurement of a parameter of the semiconductor device.

In another embodiment of the present invention, the semiconductor device further includes a switch coupled between the ODT pin and the measure path for disconnecting the ODT pin from the measure path during a normal operation of the semiconductor device. On the other hand, the switch connects the ODT pin to the measure path upon power-up of the semiconductor device that is not performing the normal operation.

In an example embodiment of the present invention, the semiconductor device is a memory device, and a MRS (mode register set) signal from a memory controller controls the switch to disconnect the ODT pin from the measure path during the normal operation. In addition, the memory controller generates a controller termination control signal applied on the ODT pin for the normal operation. In that case, the semiconductor device also includes a normal path that transmits the controller termination control signal from the ODT pin to the ODT circuit for the normal operation.

In another embodiment of the present invention, the semiconductor device includes a first buffer coupled between the ODT pin and the normal path, and includes a second buffer coupled between the normal path, the measure path, and the ODT circuit.

In an example embodiment of the present invention, the normal path includes one of a latch circuit and a flip-flop circuit that responds to at least one of a command signal and a clock signal. In addition, the measure path is implemented with a plurality of inverters.

In a further embodiment of the present invention, when the semiconductor device is a memory device, the measured parameter includes a scattering parameter measured at a DQ pin of the memory device. The ODT circuit is coupled to the DQ pin of the memory device.

In another aspect of the present invention, a test board includes a socket for holding a semiconductor device to be tested by a tester. The test board further includes an ODT (on die termination) pin coupled to the tester that generates a tester termination control signal thereon. The tester termination control signal is coupled to an ODT circuit of the semiconductor device during measurement of a parameter of the semiconductor device. The test board also includes a DQ pin coupled to the tester that measures the parameter of the semiconductor device from the DQ pin coupled to the ODT circuit.

BRIEF DESCRIPTION OF THE DRAWINGS

The above and other features and advantages of the present invention will become more apparent when described in detail with reference to the attached drawings in which.

The figures referred to herein are drawn for clarity of illustration and are not necessarily drawn to scale. Elements having the same reference number in FIGS. 1, 2, 3, 4, 5, 6, 7, 8, and 9 refer to elements having similar structure and/or function.

DETAILED DESCRIPTION OF THE INVENTION

Figure 3:
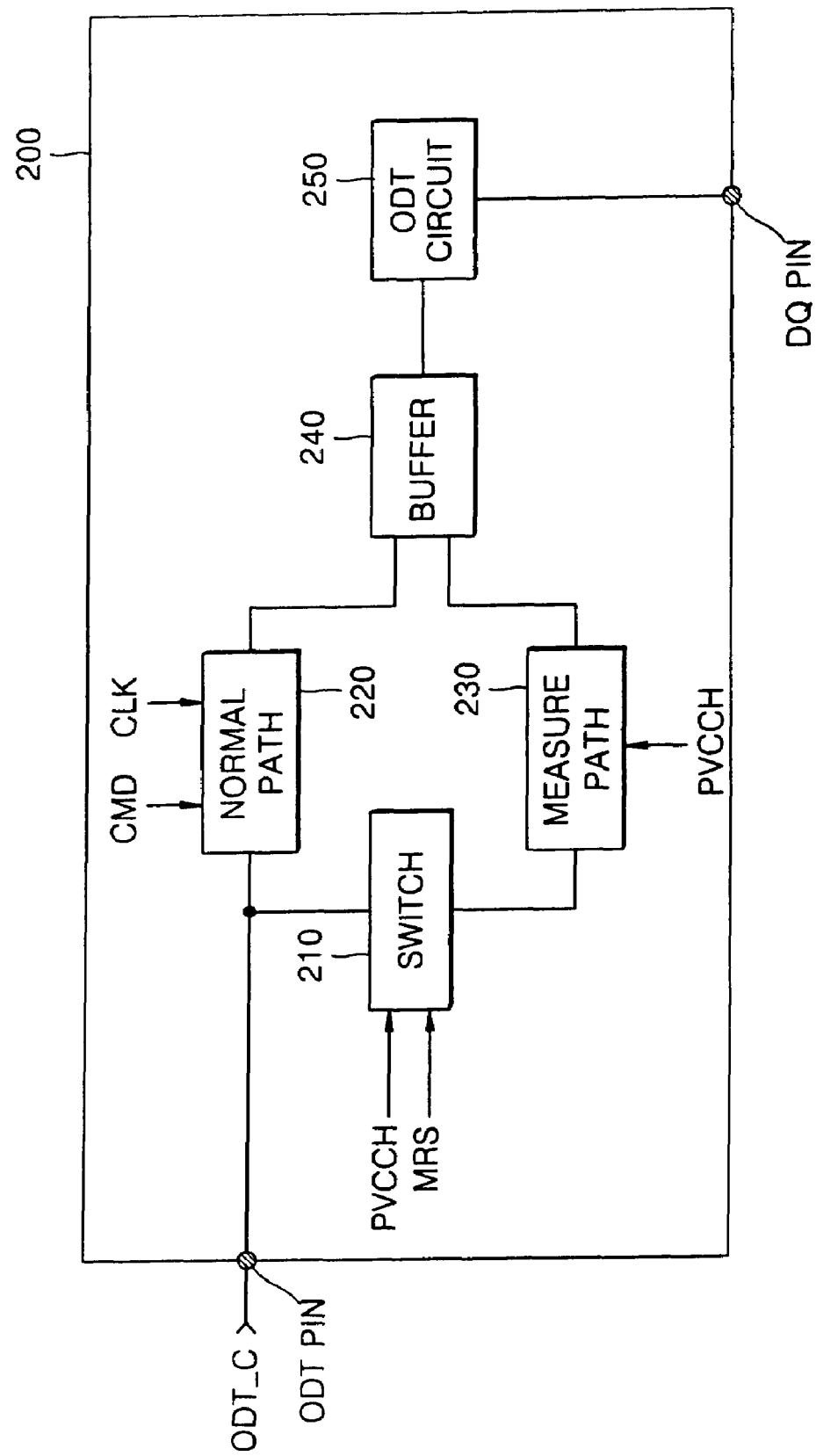
FIG. 3 is a block diagram of a semiconductor memory device for parameter measurement with control of an ODT circuit, according to an embodiment of the present invention.

FIG. 3 shows a block diagram of a semiconductor memory device 200 for parameter measurement according to an embodiment of the present invention. The present invention is described for measurement of a scattering parameter (such as a S11 or S21 parameter) from a DQ pin of the semiconductor device. However, the present invention may be used for measurement of any other type of parameter from the DQ pin of the semiconductor device.

In addition, the present invention is described for parameter measurement from the memory device 200. However, the present invention may be used for parameter measurement from a pin of any other type of semiconductor device.

Figure 1:
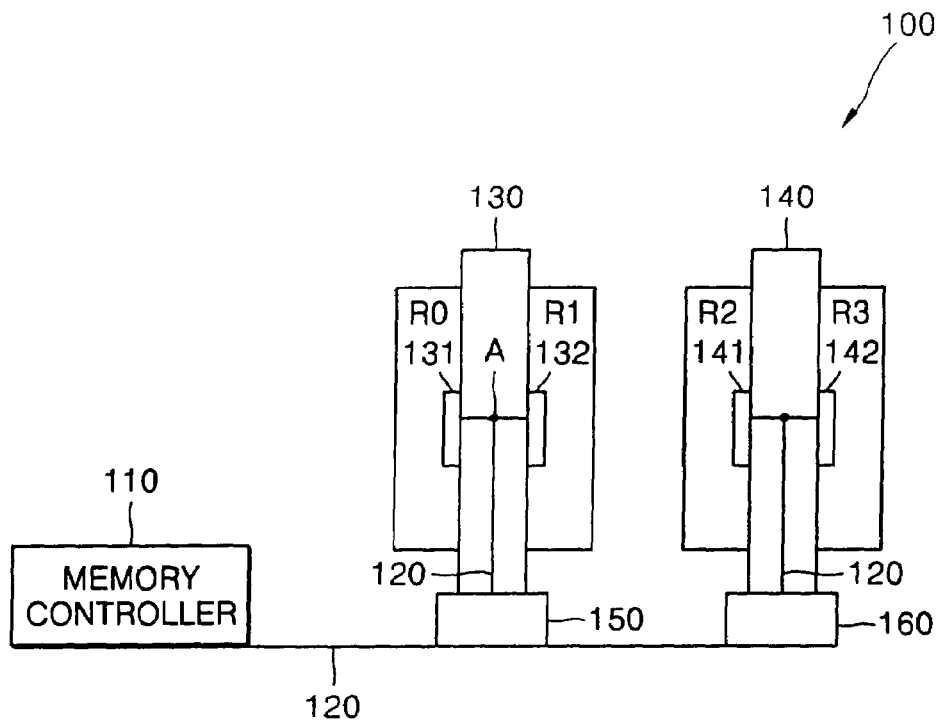
FIG. 1 shows a block diagram of a conventional memory system.

Referring to FIG. 3, the memory device 200 includes a switch 210, a normal path 220, a measure path 230, a buffer 240, and an on die termination (ODT) circuit 250. The semiconductor memory device 200 may be included in a memory module such as any of the memory modules 130 and 140 of FIG. 1 for example.

Further referring to FIG. 3, the memory device 200 includes an on die termination (ODT) pin. A tester generates a tester termination control signal that is applied as an on die termination (ODT) control signal, ODT_C, on the ODT pin. Alternatively, a memory controller (such as the memory controller 110 of FIG. 1 for example) generates a controller termination control signal that is applied as the OCT control signal, ODT_C, on the ODT pin.

Figure 9:
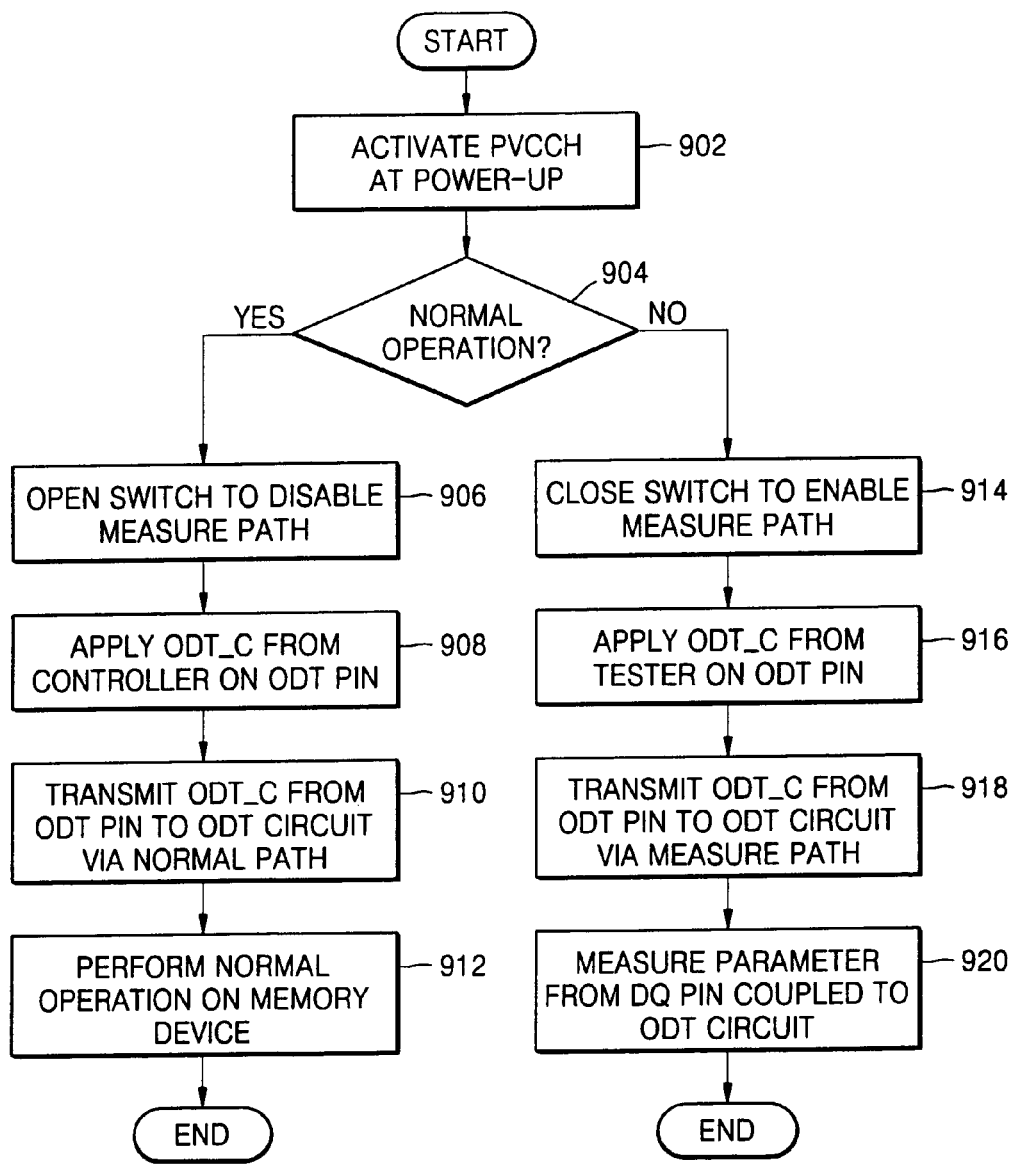
FIG. 9 shows a flow-chart of steps during operation of the semiconductor device of FIG. 3 or 4, according to an embodiment of the present invention.

Operation of the memory device 200 of FIG. 3 is now described in reference to the flow-chart of FIG. 9. Referring to FIGS. 3 and 9, upon power-up, power supply voltages VDDQ, VSSQ, VDD, and VSS are applied on the memory device 200. With such power-up, a power-up signal PVCCH is activated to a logical high state (step 902 of FIG. 9).

Thereafter, a MRS (mode register set) control signal from the memory controller indicates whether a normal operation such as a write operation or a read operation is to be performed by the memory device 200 (step 904 of FIG. 9). If a normal operation is to be performed, the MRS control signal controls the switch 210 to be opened to disconnect the ODT pin from the measure path 230 (step 906 of FIG. 9).

In that case, the controller termination control signal ODT_C from the memory controller is applied on the ODT pin (step 908 of FIG. 9) and is transmitted via the normal path 220 to the ODT circuit 250 (step 910 of FIG. 9). Thus, the logical state of the controller termination control signal ODT_C transmitted via the normal path 220 determines whether the ODT circuit 250 is turned on or turned off when the normal operation is performed on the memory device (912 of FIG. 9).

Figure 6:
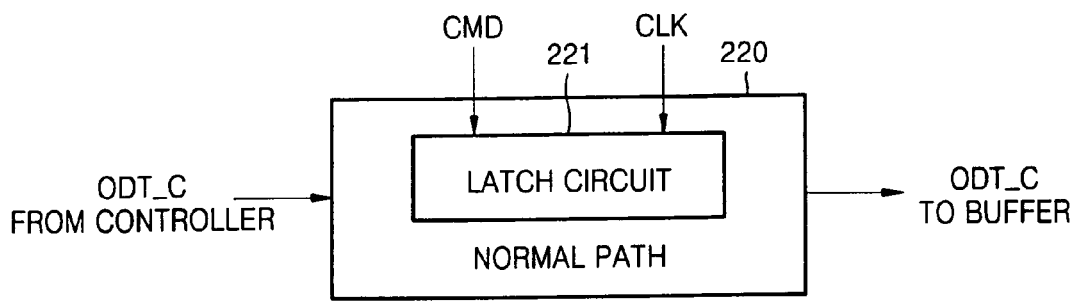
FIG. 6 illustrates implementation of a normal path of FIG. 3 or 4 with a latch circuit, according to an embodiment of the present invention.
Figure 7:
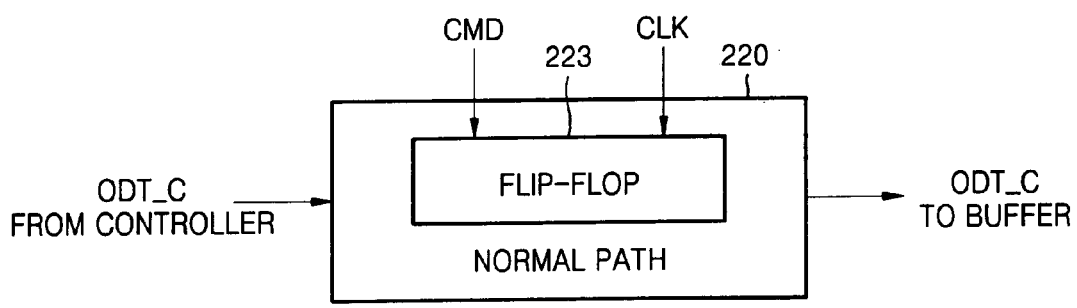
FIG. 7 illustrates implementation of the normal path of FIG. 3 or 4 with a flip-flop, according to an embodiment of the present invention.

The normal path 220 includes a circuit for performing a normal operation. For example, referring to FIG. 6, the normal path 220 includes a latch circuit 221. Alternatively, referring to FIG. 7, the normal path 220 includes a flip-flop 223. The latch circuit 221 or the flip-flop 223 operates in response to a command signal CMD or a clock signal CLK. Implementation of such a latch-circuit 221 or such a flip-flop 223 is individually known to one of ordinary skill in the art.

On the other hand, if a normal operation is not to be performed on the memory device (step 904 of FIG. 9), the switch 210 is closed from the activated PVCCH signal to couple the ODT pin to the measure path 230 (step 914 of FIG. 9). Further in that case, the tester termination control signal ODT_C from the tester is applied on the ODT pin (step 916 of FIG. 9) and is transmitted via the measure path 230 to the ODT circuit 250 (step 918 of FIG. 9). In that case, the logical state of the tester termination control signal ODT_C transmitted via the measure path 230 determines whether the ODT circuit 250 is turned on or turned off during measurement of a parameter from the DQ pin coupled to the ODT circuit (step 920 of FIG. 9).

Figure 8:
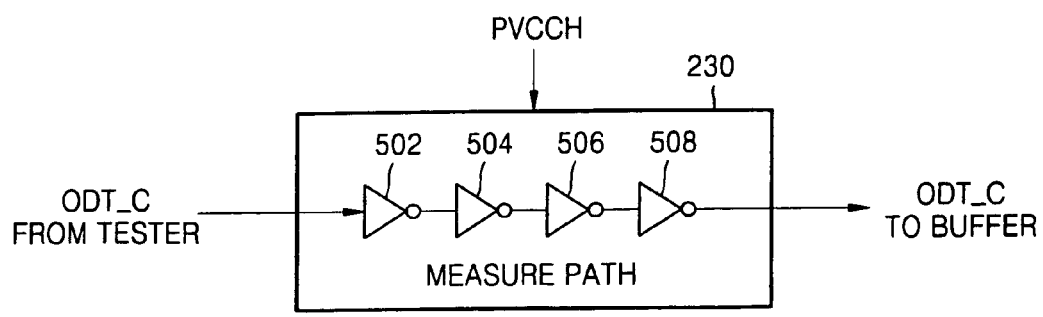
FIG. 8 illustrates implementation of a measure path of FIG. 3 or 4 with a plurality of inverters, according to an embodiment of the present invention.

Referring to FIG. 8, the measure path 230 is implemented with a plurality of inverters 502, 504, 506, and 508 connected in series. The inverters 502, 504, 506, and 508 delay the tester termination control signal ODT_C in response to the activation of the signal PVCCH signal and operate asynchronously without synchronization to the clock signal CLK.

The level of the termination control signal ODT_C from the ODT pin to the normal path 220 (or the switch 210) is a TTL level having a swing range of 0.4 volt for example. The level of the termination control signal ODT_C transmitted via the normal path 220 and the measure path 230 is a CMOS level having a swing range of 1.8 volt for example.

The buffer 240 buffers the termination control signal ODT_C transmitted via the normal path 220 or the measure path 230 and transmits the buffered termination control signal ODT_C to the ODT circuit 250. The buffer 240 is also referred to as a repeater.

Figure 2:
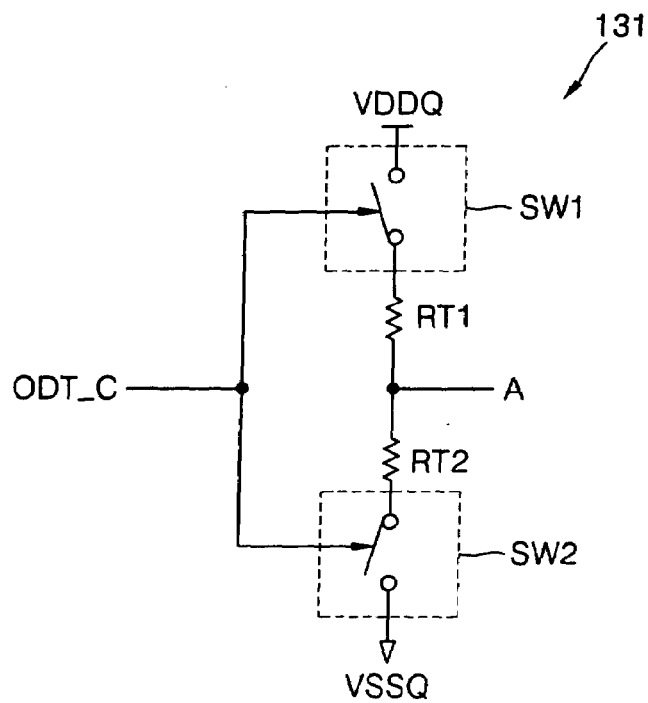
FIG. 2 is a circuit diagram showing an example ODT circuit of FIG. 1.

The ODT circuit 250 of FIG. 3 is implemented similarly as the ODT circuit 131 of FIG. 2 and is connected to the DQ pin, in one embodiment of the present invention. An S11 parameter, which is a reflection coefficient at the DQ pin, is measured by the tester as the ODT_C signal from the tester is coupled via the measure path 230 to the ODT circuit 250. The ODT circuit 250 is turned on or off in response to the logical state of the ODT_C signal from the buffer 240. For example, the ODT circuit 250 is turned on when the ODT_C signal from the buffer 240 has a logical high state for an impedance matching function.

In this manner, the memory device 200 includes the measure path 230 such that the tester may control the ODT circuit 250 during measurement of a parameter, such as the S11 scattering parameter, from the DQ pin. Thus, the tester may measure the parameter while accounting for both cases of the ODT circuit 250 being turned on or turned off for more accurate characterization with the parameter. For example with the S11 scattering parameter, the channel bus 120 may be characterized more accurately resulting in improved integrity of signals transmitted via the channel bus 120.

Figure 4:
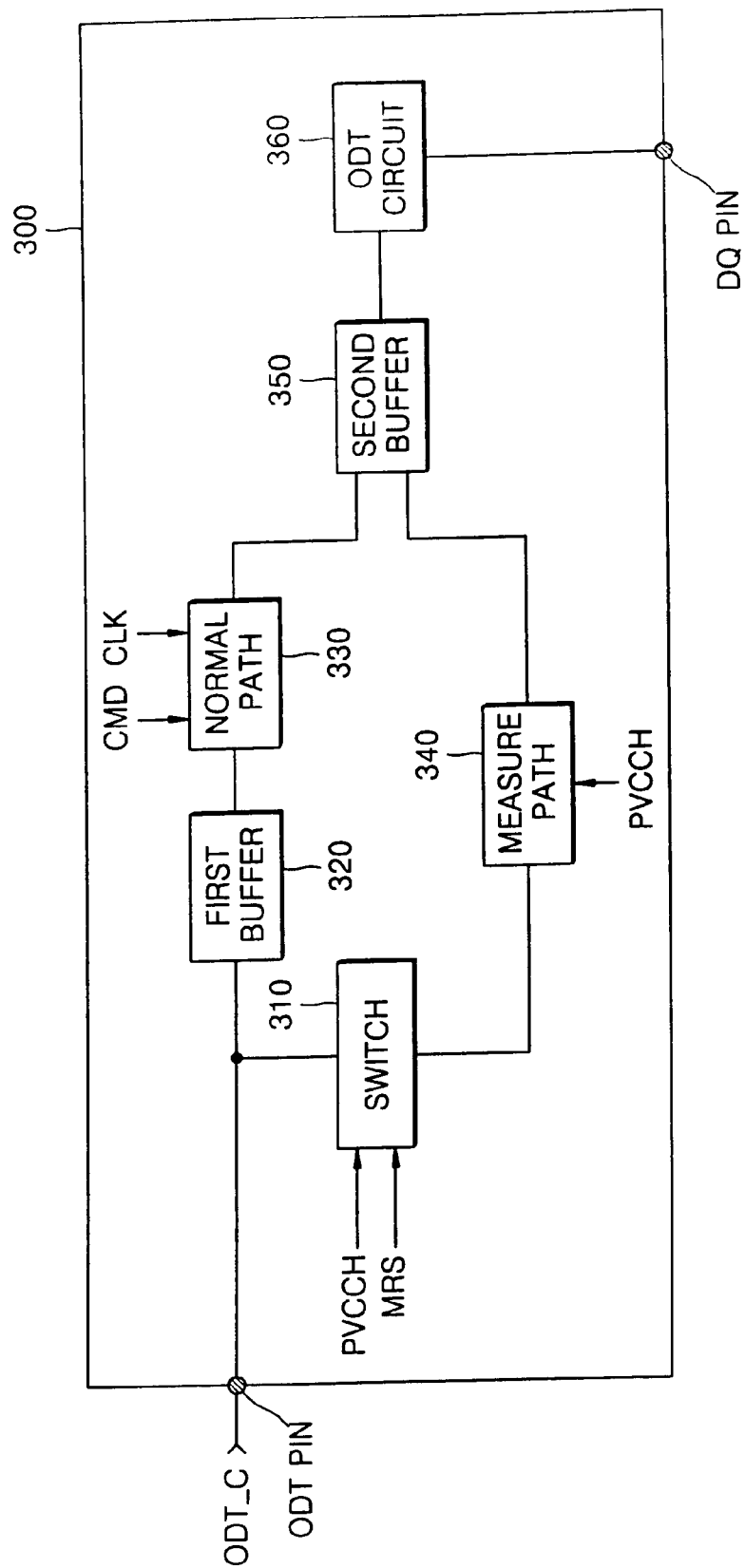
FIG. 4 is a block diagram of a semiconductor memory device for parameter measurement with control of the ODT circuit, according to another embodiment of the present invention.

FIG. 4 is a block diagram schematically showing a semiconductor memory device 300 according to another embodiment of the present invention. The memory device 300 of FIG. 4 includes a switch 310, a first buffer 320, a normal path 330, a measure path 340, a second buffer 350, and an on die termination (ODT) circuit 360. The memory device 300 may be included in a memory module such as any of the memory modules 130 and 140 of FIG. 1 for example.

In addition, the switch 310, the normal path 330, the measure path 340, the second buffer 350, and the on die termination (ODT) circuit 360 of FIG. 4 operate similarly to the switch 210, the normal path 220, the measure path 230, the buffer 240, and the ODT circuit 360, respectively, of FIG. 3, as described in reference to FIG. 9. However, the memory device 300 of FIG. 4 further includes the first buffer 320 that buffers the controller OCT_C signal between the ODT pin and the normal path 330.

Such buffering is especially advantageous when the level of the signal from the ODT pin is different from the level of the signal through the normal path 330. For example, the level of the termination control signal ODT_C from the ODT pin to the normal path 330 is a TTL level having a swing range of 0.4 volt. The level of the termination control signal ODT_C transmitted via the normal path 330 is a CMOS level having a swing range of 1.8 volt. In that case, the first buffer 320 provides buffering between such different signal levels.

Figure 5:
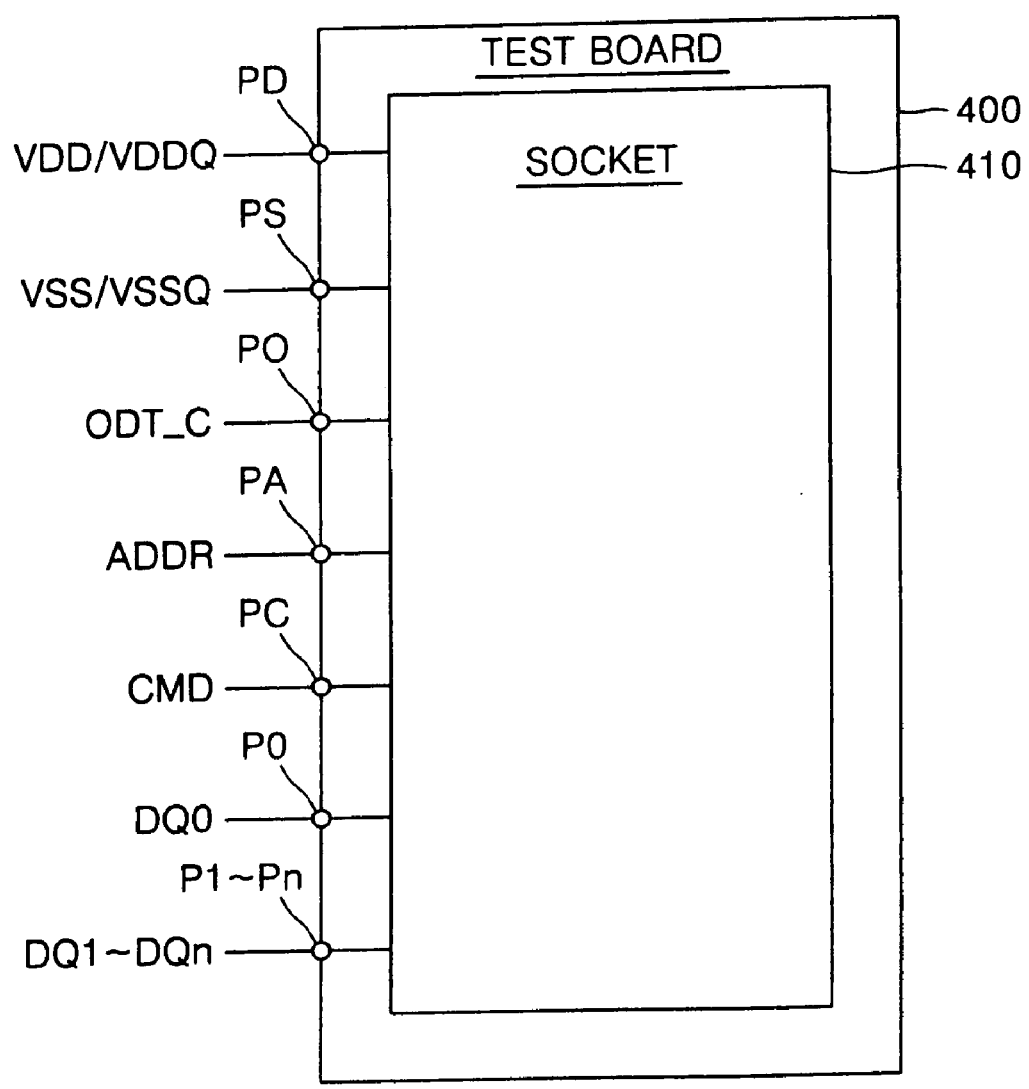
FIG. 5 is a block diagram of a test board for parameter measurement of the semiconductor memory device with control of the ODT circuit, according to an embodiment of the present invention.

FIG. 5 is a block diagram of a test board 400 for parameter measurement of the memory device 200 or 300 according to an embodiment of the present invention. The test board 400 includes power supply voltage pins PD, ground voltage pins PS, an ODT pin PO, an address pin PA, a command pin PC, DQ pins P0 and P1~Pn, and a socket 410. The test board 400 may include a clock pin (not shown) via which a clock signal is transmitted.

The memory device 200 or 300 of FIG. 3 or 4 is installed (or inserted) in (or into) the socket 410, so as to measure a parameter from the memory device. Such a parameter is the scattering S11 parameter measured from the DQ pin, P0, in an example embodiment of the present invention.

A tester (not shown) such as a network analyzer supplies power supply voltages VDD/VDDQ to power supply voltage pins of the semiconductor memory device installed in the socket 410 via the power supply voltage pins PD. In addition, the tester supplies ground voltages VSS/VSSQ to ground voltage pins of the semiconductor memory device installed in the socket 410 via the ground voltage pins PS. The voltages VDDQ and VSSQ are power supplies applied to a circuit related to data transmission from the memory device, and the voltages VDD and VSS are power supplies applied to a peripheral circuit of the memory device.

The tester applies a termination control signal ODT_C to the ODT circuit of the memory device installed in the socket 410 through the ODT pin PO. The termination control signal ODT_C is used to turn on or off the ODT circuit of the semiconductor memory device installed in the socket 410. For example, when the termination control signal ODT_C is activated to a logical high state, the ODT circuit is turned on, and when the termination control signal ODT_C is deactivated to a logical low state, the ODT circuit is turned off.

The tester measures the S11 parameter at a DQ pin (for example, coupled to the first DQ pin P0 of the test board 400) after applying the termination control signal ODT_C and the power supplies VDDQ, VSSQ, VDD, and VSS on the memory device. For the S11 parameter, the tester measures an output signal at a first DQ pin P0 in response to an input signal applied at the first DQ pin P0. The S11 parameter is determined as the ratio of such output and input signals at the first DQ pin P0. For such a S11 parameter measurement, the other DQ pins P1~Pn are floated or biased at a logical low state. In addition, the address pin PA and the command pin PC are also floated for the S11 parameter measurement.

In this manner, the test board 400 includes the ODT pin PO for coupling the termination control signal ODT_C from the tester to the ODT circuit of the tested memory device. Thus, the test board 400 advantageously allows for control of the ODT circuit of the memory device by the tester.

While the present invention has been particularly shown and described with reference to exemplary embodiment thereof, it will be understood by those skilled in the art that various changes in form and details may be made therein without departing from the spirit and scope of the invention as defined by the following claims.

What is claimed is:

1. A semiconductor device comprising:
   an ODT (on die termination) pin coupled to a tester that applies a tester termination control signal thereon for a test operation of the semiconductor device, and coupled to a controller that applies a controller termination control signal thereon for a normal operation of the semiconductor device,
   wherein the tester is separate from the controller;
   a measure path that is coupled to the tester during the test operation for transmitting the tester termination control signal from the ODT pin to an ODT circuit for measurement of a parameter of the semiconductor device; and
   a normal path that is coupled to the controller for transmitting the controller termination control signal from the ODT pin to the ODT circuit during the normal operation.

2. The semiconductor device of claim 1, further comprising:
   a switch coupled between the ODT pin and the measure path for disconnecting the ODT pin from the measure path during the normal operation.

3. The semiconductor device of claim 2, wherein the switch connects the ODT pin to the measure path upon power-up of the semiconductor device that is not performing the normal operation.

4. The semiconductor device of claim 2, wherein the semiconductor device is a memory device, and wherein a MRS (mode register set) signal from the controller that is a memory controller controls the switch to disconnect the ODT pin from the measure path during the normal operation.

5. The semiconductor device of claim 1, further comprising:
   a first buffer coupled between the ODT pin and the normal path.

6. The semiconductor device of claim 5, further comprising:
   a second buffer coupled between the normal path, the measure path, and the ODT circuit.

7. The semiconductor device of claim 1, wherein the normal path includes one of a latch circuit and a flip-flop circuit that responds to at least one of a command signal and a clock signal.

8. The semiconductor device of claim 1, wherein the semiconductor device is a memory device.

9. The semiconductor device of claim 8, wherein the parameter includes a scattering parameter measured at a DQ pin of the memory device, and wherein the ODT circuit is coupled to the DQ pin.

10. The semiconductor device of claim 1, wherein the ODT circuit is turned on or turned off depending on a logical state of the tester or controller termination control signal.

11. The semiconductor device of claim 1, further comprising:
    a buffer coupled between the measure path and the ODT circuit.

12. The semiconductor device of claim 1, wherein the measure path includes a plurality of inverters.

13. A method of measuring a parameter of a semiconductor device, comprising:
    applying a tester termination control signal from a tester to an ODT (on die termination) pin of the semiconductor device during a test operation of the semiconductor device;
    applying a controller termination control signal from a controller to the ODT pin during a normal operation of the semiconductor device;
    wherein the tester is separate from the controller;
    coupling the tester termination control signal from the ODT pin to an ODT circuit of the semiconductor device via a measure path during the test operation;
    coupling the controller termination control signal from the ODT pin to the ODT circuit via a normal path during the normal operation; and
    measuring by the tester the parameter from a DQ pin coupled to the ODT circuit during the test operation.

14. The method of claim 13, further comprising:
    disconnecting the ODT pin from the measure path during the normal operation.

15. The method of claim 14, further comprising:
    connecting the ODT pin to the measure path upon power-up of the semiconductor device that is not performing the normal operation.

16. The method of claim 13, further comprising:
    buffering the termination control signal before being transmitted to the ODT circuit.

17. The method of claim 13, wherein the semiconductor device is a memory device.

18. The method of claim 13, wherein the parameter includes a scattering parameter measured at the DQ pin of the semiconductor device.

* * * * *